(12) United States Patent
Bean et al.

(10) Patent No.: US 10,207,642 B2
(45) Date of Patent: Feb. 19, 2019

(54) ELECTRICAL POWER MONITORING SYSTEM

(71) Applicant: R.A. Phillips Industries, Inc., Santa Fe Springs, CA (US)

(72) Inventors: Adam Bean, Hacienda Heights, CA (US); Tom Begin, Portland, OR (US)

(73) Assignee: PHILLIPS CONNECT TECHNOLOGIES LLC, Santa Fe Springs, CA (US)

( * ) Notice: Subject to any disclaimer, the term of this patent is extended or adjusted under 35 U.S.C. 154(b) by 123 days.

(21) Appl. No.: 15/458,721

(22) Filed: Mar. 14, 2017

(65) Prior Publication Data

US 2018/0265001 A1  Sep. 20, 2018

(51) Int. Cl.

| | |
|---|---|
| *B60L 1/00* | (2006.01) |
| *B60Q 11/00* | (2006.01) |
| *H01R 13/641* | (2006.01) |
| *H01R 11/12* | (2006.01) |
| *H01R 9/18* | (2006.01) |
| *H02G 3/08* | (2006.01) |
| *H02G 3/16* | (2006.01) |
| *H02G 3/14* | (2006.01) |
| *G01R 19/145* | (2006.01) |
| *G01R 31/00* | (2006.01) |
| *B60Q 1/00* | (2006.01) |
| *B60R 16/023* | (2006.01) |
| *B60R 16/02* | (2006.01) |

(52) U.S. Cl.
CPC .......... *B60Q 11/007* (2013.01); *B60Q 1/0076* (2013.01); *B60Q 1/0094* (2013.01); *B60R 16/0215* (2013.01); *B60R 16/0239* (2013.01); *G01R 19/145* (2013.01); *G01R 31/006* (2013.01); *H01R 9/18* (2013.01); *H01R 11/12* (2013.01); *H01R 13/641* (2013.01); *H02G 3/083* (2013.01); *H02G 3/14* (2013.01); *H02G 3/16* (2013.01); *B60Y 2200/147* (2013.01)

(58) Field of Classification Search
CPC . B60Q 11/007; B60Q 1/0076; B60R 16/0215; G01R 31/006; H01R 9/18; H01R 11/12; H01R 13/641; H02G 3/083
See application file for complete search history.

(56) References Cited

U.S. PATENT DOCUMENTS 9,069,026 B1 * 6/2015 Rutkowsky ............ G01R 31/00
9,434,308 B2 * 9/2016 Bean .................... B60Q 11/005
(Continued)

*Primary Examiner* — Jared Fureman
*Assistant Examiner* — Duc M Pham
(74) *Attorney, Agent, or Firm* — Lewis Roca Rothgerber Christie LLP

(57) ABSTRACT

An electrical power monitoring system includes a base at an external surface of a wall of a junction box and including a stem configured to project through an opening in the wall, the base further including a monitoring circuit, a plurality of conductors extending through the stem and coupling the monitoring circuit to a plurality of conductive terminals in the junction box, and a fastener configured to mate with the stem of the base at an internal surface of the wall to fix the base to the wall, wherein the monitoring circuit is configured to monitor presence of electrical power at the plurality of conductive terminals, the monitoring circuit including a plurality of light sources at the external surface of the base.

20 Claims, 4 Drawing Sheets

(56) References Cited

U.S. PATENT DOCUMENTS

| | | | |
|---|---|---|---|
| 2009/0195971 A1* | 8/2009 | Phillips | H02G 3/16 |
| | | | 361/643 |
| 2011/0292663 A1* | 12/2011 | Fredrickson | B60R 16/0239 |
| | | | 362/375 |
| 2015/0137961 A1* | 5/2015 | Bean | B60Q 11/005 |
| | | | 340/431 |
| 2015/0183284 A1* | 7/2015 | Kim | B60D 1/24 |
| | | | 701/33.7 |
| 2018/0059161 A1* | 3/2018 | Slade | B60Q 1/00 |

* cited by examiner

ELECTRICAL POWER MONITORING SYSTEM

BACKGROUND

1. Field

Embodiments of the invention relate to electrical systems for trucks, trailers, and other motor vehicles.

2. Related Art

Trailers that are hitched to, and towed behind, tractors, trucks, or other vehicles have lighting systems that typically include stop lights, turn signals, brake lights, exterior lights, interior lights, or other electrical devices. These devices are often operated using controls at the interior of the vehicle towing the trailer. This may be accomplished electrically by coupling one or more electrical wires from the trailer to corresponding wires of the vehicle used to tow the trailer (e.g., via a plug and socket, such as a 7-way connector). Accordingly, by operating controls of the vehicle (e.g., a brake pedal, a turn signal switch, or another type of switch), a signal may be sent via one or more of the wires of the vehicle through the electrical coupling, and to the corresponding wire(s) of the trailer, thereby enabling the vehicle operator to effectively control circuits or devices of the trailer.

A persistent problem affecting the trucking/tractor trailer industry is the corrosion of electrical wires, electrical connections, or electrical junctions used in circuits of trucks and trailers. Corrosion may be caused by, for example, salt and de-icing agents, which are used on the roads on which the tractors and trailers travel, as well as moisture or water present on the roads and in the atmosphere. When these materials reach exposed electrical wiring or electrical connections, the materials can chemically react with the metals of the wires and connections to create rust or corrosion. Such rust and corrosion can lead to power being inconsistently or inefficiently transmitted to the lights, turn indicators, brake signals, etc., and can even lead to a total loss of power to these circuits.

Inconsistent power transmission through the electrical circuits due to bad electrical connections or due to corrosion can cause, for example, a trailer's exterior lighting system to flicker or to fail to turn on. The rust or corrosion may create a barrier at a surface of the electrical wires, or may cause the surface area of the electrical wires or the corresponding connection to be corroded away, thereby causing poor contact due to wires/pins failing to make surface contact with each other.

Manually checking for failures in the truck or trailer electrical systems and identifying the failing component can be a time-consuming process requiring special equipment and some trial and error. For instance, discovering an electrical discontinuity (or a wire break) in a 7-way connector cable coupling the electrical systems of the tractor and trailer may at least involve 1) turning ON all of the electrical circuits at the trailer (e.g., all of the trailer lights), 2) identifying that at least one electrical component at the trailer is not functioning properly, 3) using a tester to check for the presence of electrical power (e.g., voltage) at the back of the tractor, and if power is present, 4) swapping the 7-way connector cable with a known working cable, and 5) determining if that causes the failure, such as a light not turning on, to go away or not. Such a process may involve significant time and effort on the part of the operator and requires having possession of a working spare cable, without which identification of the problem may become very difficult.

SUMMARY

Aspects of embodiments of the invention are directed to an electrical power monitoring system for sensing the presence of electrical power (e.g., voltage) at a junction in the electrical system of a vehicle.

Aspects of embodiments of the invention are directed to junction box having an electrical power monitoring system that continuously monitors the presence of electrical power (e.g., voltage) at circuits within the junction box and visually indicates the monitored status of each of the circuits to an operator.

According to embodiments of the invention, there is provided an electrical power monitoring system including: a base at an external surface of a wall of a junction box and including a stem configured to project through an opening in the wall, the base further including a monitoring circuit; a plurality of conductors extending through the stem and coupling the monitoring circuit to a plurality of conductive terminals in the junction box; and a fastener configured to mate with the stem of the base at an internal surface of the wall to fix the base to the wall, wherein the monitoring circuit is configured to monitor presence of electrical power at the plurality of conductive terminals, the monitoring circuit including a plurality of light sources at the external surface of the base.

In some embodiments, the electrical power monitoring system further includes a clear cover configured to protect an external surface of the base against external conditions.

According to embodiments of the invention, there is provided an electrical power monitoring system including: a base at an external surface of a wall of a junction box and including a stem configured to pass through an opening in the wall, the base further including a monitoring circuit; a plurality of conductors extending through the stem and coupling the monitoring circuit to a plurality of conductive terminals in the junction box; a clear cover configured to protect an external surface of the base against external conditions; and a fastener configured to mate with the stem of the base at an internal surface of the wall to fix the base to the wall, wherein the monitoring circuit is configured to monitor presence of electrical power at the plurality of conductive terminals, the monitoring circuit including a plurality of light sources at the external surface of the base.

In some embodiments, the stem includes a threaded stem and the fastener is a locking nut having a threaded interior configured to mate with the threaded stem of the base.

In some embodiments, the plurality of light sources is configured to indicate the presence of electrical power at the plurality of conductive terminals.

In some embodiments, each light source of the plurality of light sources is electrically coupled between a ground terminal of the plurality of conductive terminals and a corresponding one of remaining ones of the plurality of conductive terminals, and the monitoring circuit further includes a plurality of resistors in series with respective ones of the plurality of light sources.

In some embodiments, the monitoring circuit further comprises: a switch configured to permit flow of current through the plurality of light sources when activated, and to restrict flow of current through the plurality of light sources when deactivated; and a controller configured to activate and deactivate the switch.

In some embodiments, the controller is configured to monitor configured to monitor the presence of electrical power at the plurality of conductive terminals and to activate the switch at a first detection of electrical power and to deactivate the switch, even in the presence of the electrical power, after passage of a set period of time.

In some embodiments, the conductive terminals are threaded studs, and each of the plurality of conductors is terminated in a ring terminal configured to be secured to a corresponding one of the threaded studs of the junction box.

In some embodiments, the electrical power monitoring system further includes a rubber gasket between the locking nut and the base and configured to secure the locking nut to the wall and to seal the opening in the wall.

In some embodiments, the clear cover includes polycarbonate lens or a transparent epoxy cover.

In some embodiments, the junction box is a J560 junction box at a nose of a trailer.

According to embodiments of the invention, there is provided a junction box including: a socket configured to receive a connector cable carrying a plurality of wires, the junction box being coupled to an electrical system of a vehicle; a plurality of conductive terminals electrically coupled to the plurality of wires of the connector cable; an electrical power monitoring system coupled to an exterior wall of the junction box, the electrical power monitoring system including: a base at an external surface of a wall of a junction box and including a threaded stem configured to pass through an opening in the wall, the base further including a monitoring circuit; a plurality of conductors extending through the stem and coupling the monitoring circuit to the plurality of conductive terminals of the junction box; a clear cover configured to protect an external surface of the base against external conditions; and a locking nut having a threaded interior configured to mate with the threaded stem of the base at an internal surface of the wall to fix the base to the wall, wherein the monitoring circuit is configured to monitor presence of electrical power at the plurality of conductive terminals, the monitoring circuit including a plurality of light sources at the external surface of the base.

In some embodiments, the plurality of light sources is configured to indicate the presence of electrical power at the plurality of conductive terminals.

In some embodiments, each light source of the plurality of light sources is electrically coupled between a ground terminal of the plurality of conductive terminals and a corresponding one of remaining ones of the plurality of conductive terminals, and the monitoring circuit further includes a plurality of resistors in series with respective ones of the plurality of light sources.

In some embodiments, the conductive terminals are threaded studs, and each of the plurality of conductors is terminated in a ring terminal configured to be secured to a corresponding one of the threaded studs of the junction box.

In some embodiments, the junction box further includes a rubber gasket between the locking nut and the base and configured to secure the locking nut to the wall and to seal the opening in the wall.

In some embodiments, the clear cover includes polycarbonate lens or a transparent epoxy cover.

In some embodiments, the junction box is a J560 junction box at a nose of a trailer, and the connector cable is connected to the electrical system of a tractor physically coupled to the trailer.

BRIEF DESCRIPTION OF THE DRAWINGS

The accompanying drawings, together with the specification, illustrate exemplary embodiments of the invention, and, together with the description, serve to explain aspects of embodiments of the invention. The above and other features and aspects of the invention will become more apparent by the following detailed description of exemplary embodiments thereof with reference to the attached drawings, in which.

DETAILED DESCRIPTION

Figure 1:
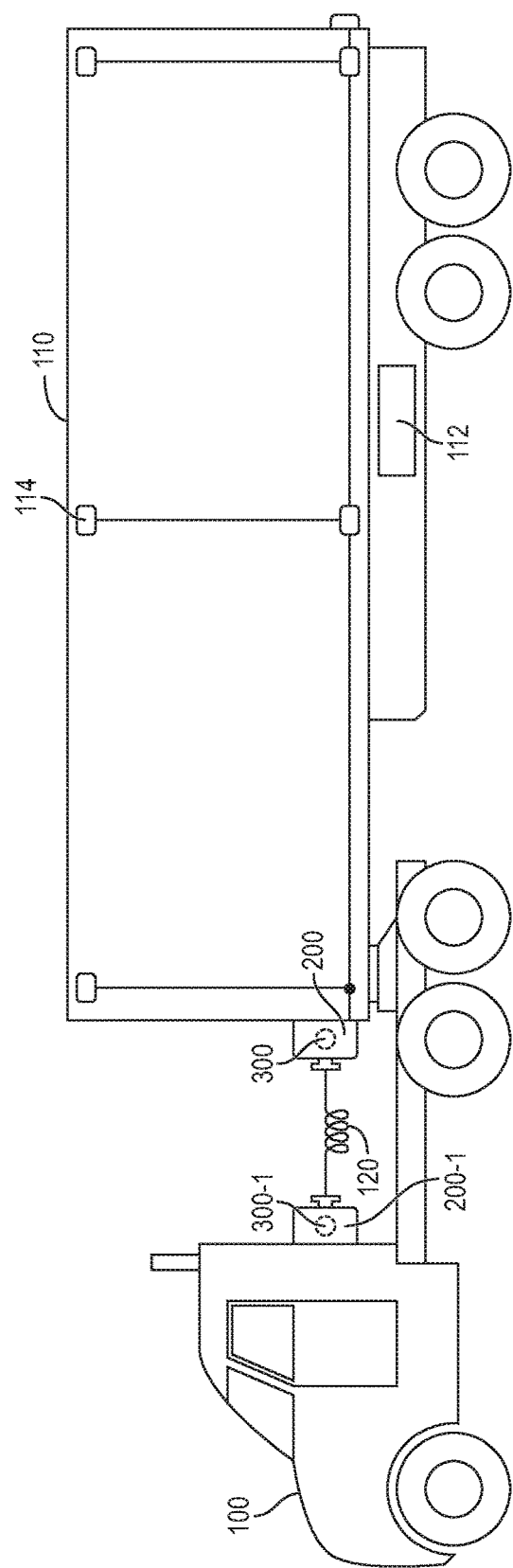
FIG. 1 is a schematic diagram of a tractor and trailer employing one or more electrical power monitoring systems, according to some embodiments of the invention.

Hereinafter, embodiments of the invention will be described more fully with reference to the accompanying drawings, in which, exemplary embodiments of the invention are shown. As those skilled in the art would realize, the described embodiments are susceptible to various modifications and alternative forms without departing from the spirit or scope of the invention. For clarity of the description of the invention, some elements or features not required for the complete understanding of the invention may be omitted.

Like reference numerals in the drawings denote like elements, and repeated descriptions thereof may be omitted.

FIG. 1 is a schematic diagram of a tractor 100 and trailer 110 employing one or more electrical power monitoring systems 300, according to some embodiments of the invention.

Referring to FIG. 1, the electrical system of a tractor 100, which may be powered by a battery or an alternator housed at the tractor 100, may be electrically wired to, and provide power to, the electrical system of a trailer 110 via a connector cable (e.g., a 7-way connector cable, cord, or harness) 120. The connector cable 120 may be electrically coupled to the electrical systems of the tractor 100 and trailer 110 through the tractor junction box 200-1 and the trailer junction box (i.e., a trailer nose box) 200, respectively. The electrical system of the trailer 110 may include, for example, a battery 112, a plurality of auxiliary devices (e.g., external electrical devices) 114 that may receive power from the tractor 100 through the connector cable 120 and/or the battery 112, and/or the like. The auxiliary devices 114 may include stop lights, turn signals, brake lights, exterior lights, interior lights, an anti-lock braking system (ABS) and/or other electrical devices external to the tractor 100, which may be attached to or provided in the trailer 110.

According to some embodiments of the invention, an electrical power monitoring system 300 may monitor the flow of power from the electrical system of the tractor 100 to the electrical system of the trailer 110, by detecting the presence of electrical power (e.g., presence of a voltage) at a plurality of conductive terminals in the trailer junction box 200, which are coupled to corresponding wires within the connector cable 120. The electrical power monitoring system 300 may be physically attached to a wall of the trailer junction box 200 and may extend through an opening in the wall of the trailer junction box 200 to establish an electrical connection with the plurality of connectors within the trailer junction box 200 that are connected to corresponding wires within the connector cable 120. In some embodiments, the electrical power monitoring system 300 includes light sources (e.g., indicator lights) that indicate the presence of electrical power at junction box 200 to an operator (e.g., a driver or technician) by, for example, lighting up when electrical power (e.g., voltage) is detected. In examples employing a 7-way connector cable 120 that is connected to 7-pin sockets at the tractor and trailer junction boxes 200-1 and 200, the electrical power monitoring system 300 may have six light sources corresponding to the six power and signal lines of the 7-way connector cable (the 7th line may be a ground line).

According to some embodiments, the electrical power monitoring system 300 may be connected to the tractor junction box 200-1, rather than the trailer junction box 200, to monitor the presence of electrical power at the back of the tractor (i.e., at the tractor junction box 200-1).

In some embodiments, in addition to a first electrical power monitoring system 300 at the front of the trailer 110, a second electrical power monitoring system 300-1 may be attached to the tractor junction box 200-1 to indicate the presence of electrical power at the back of the tractor (i.e., at the tractor junction box 200-1). The second electrical power monitoring system 300-1 may be the same or substantially the same, in structure and function, as the electrical power monitoring system 300 described throughout this application.

In some embodiments, the electrical power monitoring system 300 aids an operator in detecting a fault in the electrical connection between the tractor 100 and the trailer 110. For example, through a simple visual inspection, the operator may determine whether electrical power is reaching the front of the trailer. Further, when the operator verifies that electric power is present at the back of the tractor (e.g., by visually inspecting a second electrical power monitoring system 300-1 or by employing another tester or monitoring mechanism at the tractor junction box 200-1), the operator may be able to readily identify a faulty connector cable (e.g., one having an electrical discontinuity) by observing the off state of a plurality of light indicators at the electrical power monitoring system 300 of the trailer junction box 200. As such, the operator may identify a faulty harness without the need for a spare working harness.

Figure 2:
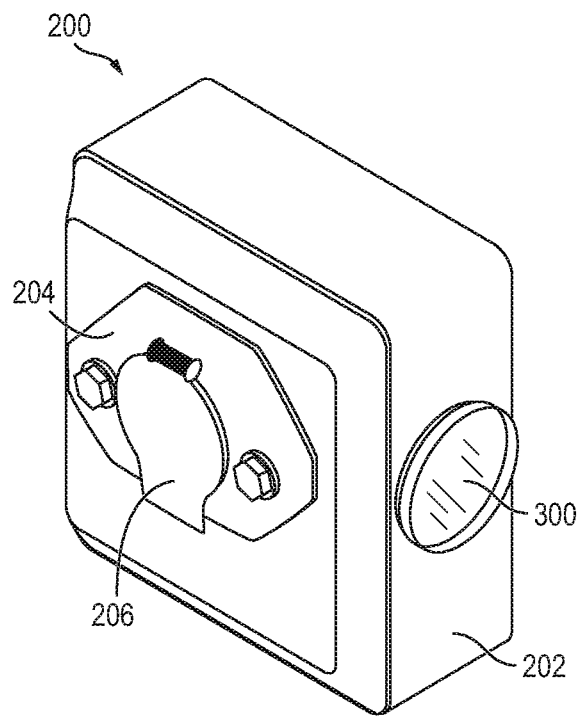
FIG. 2 is a perspective view of a junction box having attached thereto an electrical power monitoring system, according to some embodiments of the invention.

FIG. 2 is a perspective view of a junction box having attached thereto an electrical power monitoring system 300, according to some embodiments of the invention.

Referring to FIG. 2, the electrical power monitoring system 300 may be attached (e.g., affixed) to the external body of the junction box 200 at any suitable location that facilitates easy viewing by an operator. For example, the electrical power monitoring system 300 may be attached to a side wall 202 of the junction box 200 (as shown) or to a top or front side of the junction box 200. For ease of description, henceforth, the junction box 200 may refer to either one of the trailer or tractor junction boxes 200 or 200-1.

The junction box 200 is capable of receiving the connector cable 120 at the socket 204, when the cap 206 is lifted. In some embodiments, the socket 204 may be compatible with the SAE (Society of American Engineers) J-560 standard, and the connector cable 120 may be a 7-conductor J560 harness. However, embodiments of the invention are not limited thereto, and the socket 204 and the connector cable 120 may be compatible with 5-pin, 6-pin, 7-pin, or 13-pin ISO standards, and/or any other suitable standard.

Figure 3:
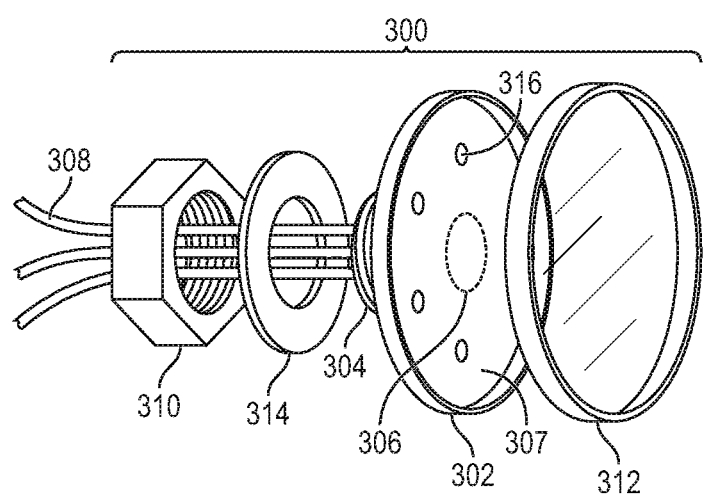
FIG. 3 is an exploded view of the electrical power monitoring system, according to some embodiments of the invention.
Figure 4:
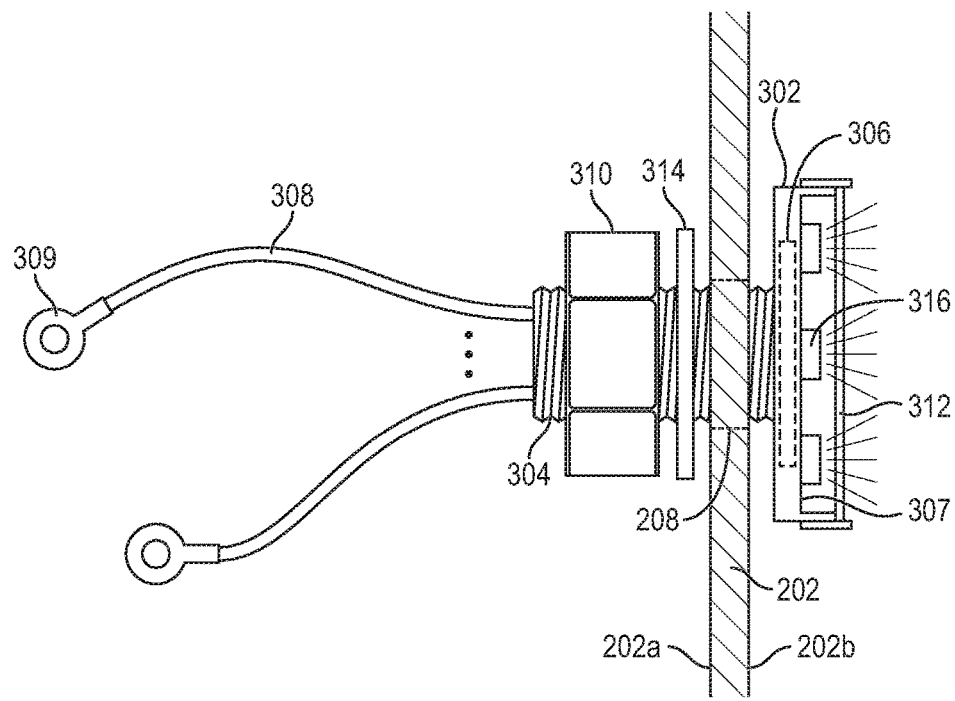
FIG. 4 is a side view illustrating the assembly of the electrical power monitoring system around the wall of the junction box, according to some embodiments of the invention.

FIG. 3 is an exploded view of the electrical power monitoring system 300, according to some embodiments of the invention. FIG. 4 is a side view illustrating the assembly of the electrical power monitoring system 300 around the wall 202 of the junction box 200, according to some embodiments of the invention.

Referring to both FIGS. 2-3, according to some embodiments, the electrical power monitoring system 300 includes a base 302, which has a stem 304 and includes a monitoring circuit 306 integrated therein, a plurality of conductors (e.g., wires) 308 extending through the stem 304 and coupling the monitoring circuit 306 to a plurality of conductive terminals in the junction box 200, and a fastener (e.g., a locking nut) 310 for engaging with the stem 304 of the base 302 at an internal surface 202a of the wall 202 to secure (e.g., fix) the base 302 to the wall 202. In some embodiments, the stem 304 is threaded and the fastener 310 is a locking nut having a threaded interior for mating with the threaded stem 304 of the base 302. However, embodiments of the invention are not limited thereto, and the fastener 310 may be fixedly engaged with the stem 304 using any suitable mechanism.

Referring to FIG. 4, the wall 202 of the junction box 200 has an opening 208 through which the stem 304 of the base 302 extends. In some embodiments, the base 302 may have an area greater than that of the opening 208 such that when the stem 304 extends through the opening 208, the base 302 completely covers the opening 208, and the opening 208 is not exposed to the outside. In some examples, the opening 208 may have a diameter of about 0.5 inch, about 0.75 inch, or about 1 inch. The base 302 may be made of any suitable material such as Delrin, PVC, and/or glass. In some examples, a gasket (e.g., a rubber gasket or washer) 314 may be positioned between the locking nut 310 and the internal surface 202a of the wall 202 to secure the base 302 and the locking nut 310 and to the wall 202 and to seal the opening 208 by filling any irregularities in the mating surfaces of the locking nut 310 and the wall 202 and preventing leakage of moisture and other contaminants into the junction box 200 from the outside.

The stem 304 may be substantially tubular with a hollow interior along the length of the stem 304, or may be a solid molding around the conductors 308.

According to some embodiments, the monitoring circuit 306 monitors the presence of electrical power at the plurality of conductive terminals (by, e.g., measuring voltage) within the junction box 200 and includes a plurality of light sources (e.g., indicator lights) 316 to indicate the presence or lack of electrical power at the monitored conductive terminals by emitting or not emitting light. The plurality of light sources 316 may be positioned at an external face (e.g., at an external surface) 307 of the base 302 facing away from the junction box 200. In some examples, the electrical power monitoring system 300 may further include a clear (e.g., translucent or transparent) cover 312 for protecting the external face 307 of the base 302 and the plurality of light sources 316 integrated thereon against external elements and conditions. For example, the clear cover 312 may prevent moisture from reaching the base 302 and damaging the electronic circuitry of the monitoring circuit 306, and may physically protect the base 302 and the monitoring circuit 306 against the impact of flying debris and/or the like. The clear cover 312 may be made of polycarbonate material, clear epoxy, and/or the like.

The clear cover 312 may be molded over the base 302, may be sonic welded to the base 302, or may be affixed to the base 302 via any other suitable method.

As shown in FIGS. 2-3, in some embodiments, the base may be a substantially circular disc abutting against the exterior surface 202b of the wall 202 of the junction box 200. However, the shape of the base is not limited thereto, and may be, for example, elliptical, hexagonal, square, or any other suitable shape. The clear cover 312 may have a shape corresponding to that of the base 302.

While not shown in the figures, a second gasket (e.g., washer/seal) may be positioned between the exterior surface 202b of the wall 202 to secure the physical connection between the base 302 and the exterior surface 202b wall 202. In some examples, the base 302 may be flush against the exterior surface 202b.

Figure 5:
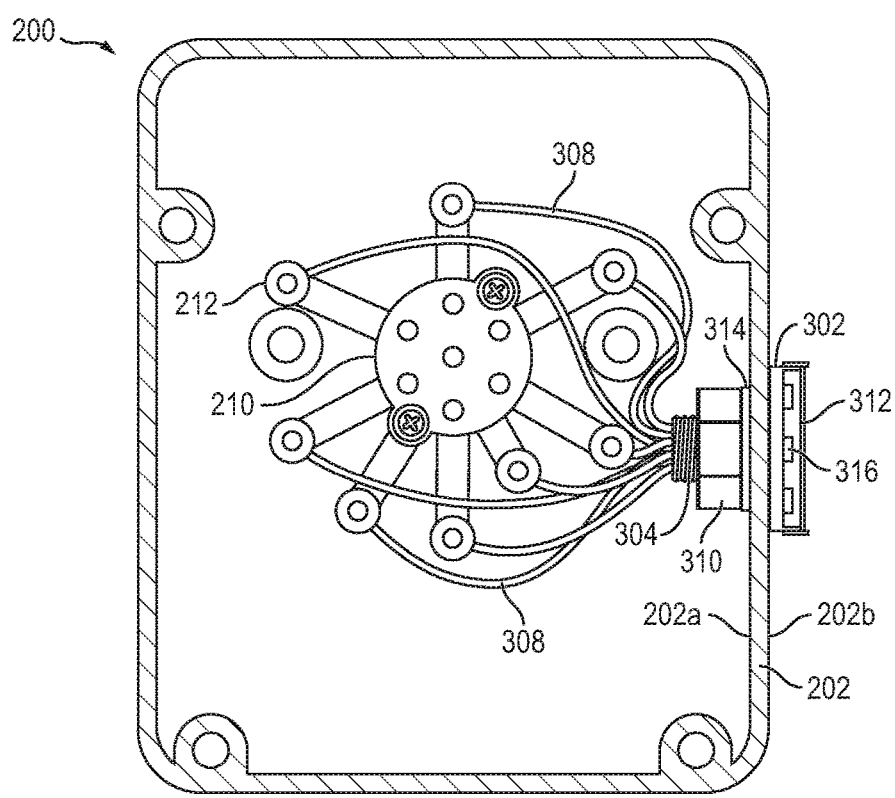
FIG. 5 illustrates the electrical connection between the electrical power monitoring system and the junction box, according to some embodiments of the invention.
Figure 6:
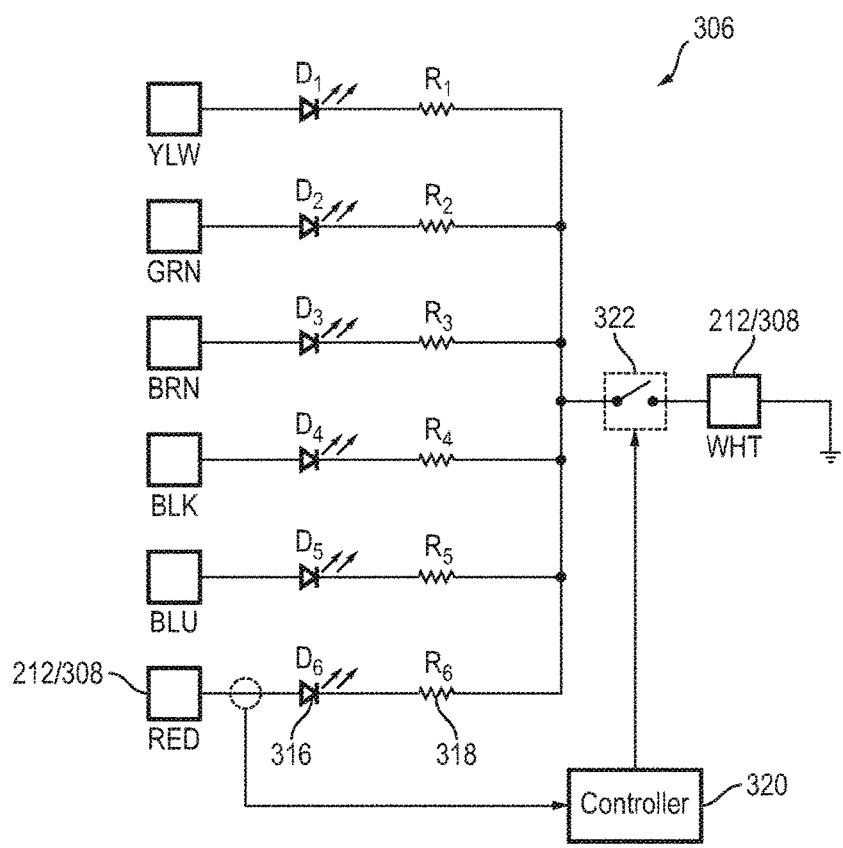
FIG. 6 is a schematic representation of the monitoring circuit of the electrical power monitoring system, according to some embodiments of the invention.

FIG. 5 illustrates the electrical connection between the electrical power monitoring system 300 and the junction box 200, according to some embodiments of the invention. FIG. 6 is a schematic representation of the monitoring circuit 306 according to some embodiments of the invention.

Referring to FIG. 5, when the connector cable 120 is plugged into the socket 204 of the junction box 200, a connector plug 210 of the junction box 200 establishes an electrical connection with the multi-wire connector cable 120 and distributes the corresponding electrical power and/or signals from the connector cable 120 to an electrical system (e.g., the electrical system of the trailer 110). The connector plug 210 has connected to it a plurality of conductive terminals (e.g., termination studs) 212 that match the number of, and are electrically connected to respective ones of, the wires carried by the multi-wired connector cable 120.

Referring to FIGS. 4-5, in some embodiments the plurality of conductors 308 of the electrical power monitoring system 300 have conductive terminal ends 309 at their respective ends, which are configured to be physically affixed to, and electrically connected to, the conductive terminals 212 of the junction box 200. In some embodiments, the conductive terminal ends 309 are ring terminals that are received by threaded studs of the conductive terminals 212. However, embodiments of the invention are not limited thereto. For example, an electrical and physical connection between the conductive terminal ends 309 and the conductive terminals 212 may be established through push-on connections (e.g., heat-shrink push-on male and female bullet terminals), spliced in-line connections, and/or the like.

In examples in which the junction box 200 is J560 compatible, each of the wires carried by the multi-wired connector cable 120, and the corresponding conductive terminal 212, may have a particular color designation and may provide power to a different external device (e.g., light) in the trailer electrical system. As an example, the following table provides the color designations of some of said conductive terminals 212, and the corresponding trailer circuit to which they provide power:

| | |
|---|---|
| Red | Brake/stop lights |
| Black | License plate lighting |
| Brown | Marker lights |
| Blue | Auxiliary circuits (e.g., ABS, lift gates) |
| Green | Right turn signal |
| yellow | Left turn signal |
| White | System Ground |

According to some embodiments, the monitoring circuit 306 senses (e.g., continuously senses) the voltage at each of the conductors 308 and indicates the presence of electrical power at each of the conductors 308 via the plurality of light sources 316, which may be light emitting diodes (LEDs). In some examples, the conductors 308 may be color coded to match the color designations of the associated conductive terminals 212. Additionally, markings may be added to the external face 307 of the base 302 to indicate how the light sources 316 correspond to the conductive terminals 212. For example, each of the light sources 316 may be labeled as one of Rd (red), Bk (black), Br (brown), Bl (blue), Gr (green), or Yl (yellow).

Referring to FIG. 6, according to some embodiments, the monitoring circuit 306 includes a plurality of resistors 318 connected in series with the plurality of light sources 316 to form resistor-light source pairs corresponding to respective ones of the non-ground conductors 308.

In examples in which the junction box uses a J560 compatible socket 204, the monitoring circuit 306 includes six light sources 316, for example, LEDs D1 to D6, and six resistors 318, for example, resistors R1 to R6. In some examples, the resistors R1 to R6 may each have a value of about 470 ohms. Each LED-resistor pair (D1-R1, D2-R2 . . . or D6-R6) may be electrically coupled between one of the non-ground conductors 308 (or non-ground conductive terminals 212 having a non-white color designation) and the grounded conductor 308 (or grounded termination stud 212 having a white color designation). When a sufficiently high voltage (e.g., 12V) exists at each of the non-ground conductors 308 (or non-ground conductive terminals 212), a small electrical current may be established through the corresponding pair of light source 316 and resistor 318, causing the corresponding light source 316 to be turned on. This indicates to the operator that electrical power is present at the corresponding line. When no voltage is present at a non-ground conductor 308 (or a non-ground conductive terminals 212), no current will pass through the corresponding pair of light source 316 and resistor 318, causing the corresponding light source 316 to be turned off. This indicates to the operator that no electrical power is present at the corresponding line. This may point to a faulty connector cable 120, since the lack of power may be caused by an electrical discontinuity within the connector cable 120.

According to some embodiments, the monitoring circuit 306 further includes a controller 320 and a switch 322 that is controlled (e.g., activated and deactivated) by the controller 320 for the purpose of turning ON or OFF the electrical power monitoring system 300. The switch 322 may permit current flow through the plurality of light sources 316 when activated, and may restrict (e.g., shut off) current flow through the plurality of light sources 316 when deactivated. The controller 320 may monitor the existence of power at one or more of the non-ground conductors 308 (or non-ground conductive terminals 212), and when power is first detected at the one or more monitored conductors/terminals, the controller 320 may activate the switch 322 to permit current to flow through the light sources 316 (thus, turning ON the electrical power monitoring system 300). In some embodiments, after the passage of set period of time (e.g., about 5 minutes), the controller 320 may deactivate the switch 322 to turn off the plurality of light sources 316 (thus, turning OFF the electrical power monitoring system 300). The switch 322 may remain deactivated until power at the one or more monitored conductors/terminals is reset, for example, by the connector cable 120 being disconnected and reconnected to the junction box 200 or by the tractor 100 being restarted. As a result, the electrical power monitoring system 300 may only perform a monitoring function for a preset period of time after the truck 100 is turned on or a current carrying connector cable 120 is connected to the junction box 200. This prevents the light sources 316 from remaining continuously on while the truck is on the road, for example, which may otherwise be a source of distraction for nearby cars on the road.

In some embodiments, controller 320 may determine the existence of power at the input of the electrical power monitoring system 300 by measuring a voltage at the one or more of the non-ground conductors 308 (or non-ground conductive terminals 212) that is higher than a voltage threshold (e.g., about 3 V; however the threshold may be as high as about 32 V). In other embodiments, the controller 320 may measure the current flowing through the one or more non-ground conductors 308 (or non-ground conductive terminals 212) and the corresponding one or more light sources 316, and may determine that power is present when the one or more measured currents is/are higher than a current threshold (e.g., about 0 A; however the threshold may be as high as about 10 A). However, embodiments of the present invention are not limited thereto, and the controller 320 may make a determination regarding the existence of power at the input of the electrical power monitoring system 300 based on both a voltage and current measurement.

In some examples, the switch may be electrically coupled between the resistors 318 and the grounded conductor 308 (or grounded termination stud 212). In some examples, the switch 322 may include a plurality of switches corresponding to the plurality of light sources 316. In such examples, each of the plurality of switches may be electrically coupled between one of the light sources 316 and the corresponding non-ground conductor 308 (or non-ground conductive terminals 212) and may operate to permit/restrict current through the light source 316 when activated/deactivated by the controller 320.

According to embodiments of the invention, the design of the electrical power monitoring system 300 makes it easy to retrofit a junction box 200 or any other electrical connection box to display status of power carrying conductors. Additionally, by continuously monitoring and visually reporting the status of the electrical connection at the front of the trailer and/or the back of the trailer, the electrical power monitoring system 300 simplifies the process of identifying the cause and locations of faults in the electrical systems of the tractor and trailer.

While this invention has been described in detail with particular references to illustrative embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of operation can be practiced without meaningfully departing from the principles, spirit, and scope of this invention, as set forth in the following claims and equivalents thereof.

The terms used in the present specification are used to describe particular embodiments, and are not intended to limit the invention. For example, it will be understood that, although the terms "first", "second", etc. may be used herein to describe various elements, these elements would not be limited by the strict construction of these terms. Instead, these terms are used only to distinguish one component from another. Further, an expression used in the singular encompasses the expression of the plural, unless it has a clearly different meaning in the context. In the present specification, it is to be understood that the terms such as "comprising", "including", "having", etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when an element or layer is referred to as being "on", "connected to", or "coupled to" another element or layer, it can be directly on, connected to, or coupled to the other element or layer, or one or more intervening elements or layers may also be present. Similarly, when an element or layer is referred to as being "connected at" or "coupled at" another element or layer, the element or layer may be directly or indirectly "connected at" or "coupled at" said another element or layer. When an element is referred to as being "directly on", "directly connected to", "directly coupled to", "directly connected at", or "directly coupled at" another element or layer, there are no intervening elements or layers present. Like numbers refer to like elements throughout. As used herein, the term "and/or" includes any and all combinations of one or more of the associated listed items. When the phrase "at least one of" is applied to a list, it is being applied to the entire list, and not to the individual members of the list.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Further, when describing embodiments of the present invention, the use of "may" relates to "one or more embodiments of the present invention".

As used herein, the term "substantially", "about", and similar terms are used as terms of approximation and not as terms of degree, and are intended to account for the inherent deviations in measured or calculated values that would be recognized by those of ordinary skill in the art. Also, the terms "use", "using", and "used" may be considered synonymous with the terms "utilize", "utilizing", and "utilized", respectively.

What is claimed is:

1. An electrical power monitoring system comprising:
a base at an external surface of a wall of a junction box and comprising a stem configured to project through an opening in the wall, the base further comprising a monitoring circuit;
a plurality of conductors extending through the stem and coupling the monitoring circuit to a plurality of conductive terminals in the junction box; and
a fastener configured to mate with the stem of the base at an internal surface of the wall to fix the base to the wall,
wherein the monitoring circuit is configured to monitor presence of electrical power at the plurality of conductive terminals, the monitoring circuit comprising a plurality of light sources at the external surface of the base.

2. The electrical power monitoring system of claim 1, further comprising a clear cover configured to protect an external surface of the base against external conditions.

3. An electrical power monitoring system comprising:
a base at an external surface of a wall of a junction box and comprising a stem configured to pass through an opening in the wall, the base further comprising a monitoring circuit;
a plurality of conductors extending through the stem and coupling the monitoring circuit to a plurality of conductive terminals in the junction box;
a clear cover configured to protect an external surface of the base against external conditions; and
a fastener configured to mate with the stem of the base at an internal surface of the wall to fix the base to the wall,
wherein the monitoring circuit is configured to monitor presence of electrical power at the plurality of conductive terminals, the monitoring circuit comprising a plurality of light sources at the external surface of the base.

4. The electrical power monitoring system of claim 3, wherein the stem comprises a threaded stem and the fastener is a locking nut having a threaded interior configured to mate with the threaded stem of the base.

5. The electrical power monitoring system of claim 3, further comprising a rubber gasket between a locking nut and the base and configured to secure the locking nut to the wall and to seal the opening in the wall.

6. The electrical power monitoring system of claim 3, wherein the plurality of light sources is configured to indicate the presence of electrical power at the plurality of conductive terminals.

7. The electrical power monitoring system of claim 3, wherein each light source of the plurality of light sources is electrically coupled between a ground terminal of the plurality of conductive terminals and a corresponding one of remaining ones of the plurality of conductive terminals, and
wherein the monitoring circuit further comprises a plurality of resistors in series with respective ones of the plurality of light sources.

8. The electrical power monitoring system of claim 3, wherein the monitoring circuit further comprises:
a switch configured to permit flow of current through the plurality of light sources when activated, and to restrict flow of current through the plurality of light sources when deactivated; and
a controller configured to activate and deactivate the switch.

9. The electrical power monitoring system of claim 8, wherein the controller is configured to monitor configured to monitor the presence of electrical power at the plurality of conductive terminals and to activate the switch at a first detection of electrical power and to deactivate the switch, even in the presence of the electrical power, after passage of a set period of time.

10. The electrical power monitoring system of claim 3, wherein the conductive terminals are threaded studs, and
wherein each of the plurality of conductors is terminated in a ring terminal configured to be secured to a corresponding one of the threaded studs of the junction box.

11. The electrical power monitoring system of claim 3, wherein the clear cover comprises polycarbonate lens or a transparent epoxy cover.

12. The electrical power monitoring system of claim 3, wherein the junction box is a J560 junction box at a nose of a trailer.

13. A junction box comprising:
a socket configured to receive a connector cable carrying a plurality of wires, the junction box being coupled to an electrical system of a vehicle;
a plurality of conductive terminals electrically coupled to the plurality of wires of the connector cable; and
an electrical power monitoring system coupled to an exterior wall of the junction box, the electrical power monitoring system comprising:
a base at an external surface of a wall of a junction box and comprising a threaded stem configured to pass through an opening in the wall, the base further comprising a monitoring circuit;
a plurality of conductors extending through the threaded stem and coupling the monitoring circuit to the plurality of conductive terminals of the junction box;
a clear cover configured to protect an external surface of the base against external conditions; and
a locking nut having a threaded interior configured to mate with the threaded stem of the base at an internal surface of the wall to fix the base to the wall,
wherein the monitoring circuit is configured to monitor presence of electrical power at the plurality of conductive terminals, the monitoring circuit comprising a plurality of light sources at the external surface of the base.

14. The junction box of claim 13, wherein the plurality of light sources is configured to indicate the presence of electrical power at the plurality of conductive terminals.

15. The junction box of claim 13, wherein each light source of the plurality of light sources is electrically coupled between a ground terminal of the plurality of conductive terminals and a corresponding one of remaining ones of the plurality of conductive terminals, and
wherein the monitoring circuit further comprises a plurality of resistors in series with respective ones of the plurality of light sources.

16. The junction box of claim 13, wherein the monitoring circuit further comprises:
a switch configured to permit flow of current through the plurality of light sources when activated, and to restrict flow of current through the plurality of light sources when deactivated; and
a controller configured to monitor the presence of electrical power at the plurality of conductive terminals and to activate the switch at a first detection of electrical power and to deactivate the switch, even in the presence of the electrical power, after passage of a set period of time.

17. The junction box of claim 13, wherein the conductive terminals are threaded studs, and
wherein each of the plurality of conductors is terminated in a ring terminal configured to be secured to a corresponding one of the threaded studs of the junction box.

18. The junction box of claim 13, further comprising a rubber gasket between the locking nut and the base and configured to secure the locking nut to the wall and to seal the opening in the wall.

19. The junction box of claim 13, wherein the clear cover comprises polycarbonate lens or a transparent epoxy cover.

20. The junction box of claim 13, wherein the junction box is a J560 junction box at a nose of a trailer, and
wherein the connector cable is connected to the electrical system of a tractor physically coupled to the trailer.

* * * * *